United States Patent [19]

Free

[11] 3,719,833

[45] March 6, 1973

[54] TECHNIQUE FOR COMPENSATING FOR INPUT BIAS CURRENTS OF TRANSISTORS

[75] Inventor: Maurice George Free, Tempe, Ariz.

[73] Assignee: Motorola Inc., Franklin Park, Ill.

[22] Filed: Oct. 12, 1970

[21] Appl. No.: 79,853

[52] U.S. Cl. ..................307/296, 307/255, 307/308, 330/30 D

[51] Int. Cl. ..............................................H03k 17/00

[58] Field of Search......307/255, 296, 308, 311, 315; 330/33, 30 D

[56] References Cited

UNITED STATES PATENTS

| | | | |
|---|---|---|---|
| 3,069,567 | 12/1962 | Lewis | 307/255 |
| 3,234,405 | 2/1966 | Cordero | 307/315 X |
| 3,502,932 | 3/1970 | Schneider | 307/229 X |
| 3,581,119 | 5/1971 | Grundy | 307/255 X |
| 3,524,999 | 8/1970 | Fletcher et al. | 307/308 |

*Primary Examiner*—Donald D. Forrer
*Assistant Examiner*—B. P. Davis
*Attorney*—Mueller and Aichele

[57] ABSTRACT

Input bias currents, or base currents, of transistors of one conductivity type may be compensated for by connecting the base thereof to the base of a transistor of the opposite conductivity type. The betas of the two transistors should be equal and the other transistor characteristics of the transistors should be matched. The transistors should be placed close together so as to be subject to the same environmental conditions. The transistors may, conveniently, be on the same chip as in an integrated circuit, and the principal transistors, as well as compensating transistors may be connected as Darlington pairs.

10 Claims, 2 Drawing Figures

PATENTED MAR 6 1973 3,719,833

INVENTOR.
Maurice G. Free

BY
Mueller & Aichele
ATTY'S

TECHNIQUE FOR COMPENSATING FOR INPUT BIAS CURRENTS OF TRANSISTORS

RELATED APPLICATIONS

The subject application is related to a joint application of the subject inventor and Leo L. Wisseman entitled "Neutron Radiation and Gamma Ray Hardened Adjustable Power Supply," Ser. No. 7,164, filed Jan. 30, 1970, and assigned to the same assignee as the present invention.

BACKGROUND OF THE INVENTION

This invention relates to methods of and apparatus for compensating for bias currents of transistors, of transistors of operational amplifiers and, more particularly, of transistors of an input differential amplifier stage of a transistor operational amplifier, and it is an object of the invention to provide improved methods and apparatus of this nature in each of the areas indicated.

It is a further object of the invention to provide an improved differential amplifier wherein the input bias currents of the transistors are compensated for over a wide range of bias currents.

It is a further object of the invention to provide an improved differential amplifier of the nature indicated wherein the input bias currents are compensated for including instances of undesired effects of doses of neutron radiation or other radiations of all magnitudes.

It is a further object of the invention to provide an improved bias current compensating means for differential amplifiers of the nature indicated wherein low input offset currents and low input bias currents are important requirements.

It is a further object of the invention to provide an improved radiation hardened differential amplifier wherein the increased input bias currents due to neutron or other radiations are essentially completely compensated.

Operational amplifiers customarily include a differential input stage, one or more intermediate stages and an output stage. Most of the circuit gain takes place in the differential input stage and it is this stage that is most sensitive to environmental changes such as changes in temperature, and applications of doses of radiation, for example neutron radiation or gamma ray radiation.

Neutron radiation, particularly, disrupts the base region, or alters the crystal structure, of transistors such that increased bias currents flow in the bases of the differential amplifier stage. While such defects may be correctable by appropriate treatment after radiation exposure, this cannot be done, conveniently, immediately after the exposure occurs, because the circuit may be in use as during a missile attack. For all intents and purposes, during such use, the defect in the crystal structure due to neutron radiation is permanent. Accordingly it is essential, or even vital, in such cases, that the increase in input base current of the differential amplifier pair be immediately and continuously compensated for.

For best operation, the transistors of the input differential stage are as closely matched to each other as possible. Likewise, the various resistors and other components of the circuit are as closely matched to each other as possible when two or more such components exist and perform similar functions in the same surroundings. Where the transistors, resistors and the like are discrete devices, the problems of matching may be extreme and the problem of locating the devices in close proximity to each other so that all receive the same environmental effects may be difficult to achieve. But where the devices are part of an integrated circuit the matching of appropriate components can be very closely achieved because they are formed during the same process and by the use of masks which predetermine the dimensions accurately. Also in the integrated circuit case, the devices are small and are mounted very close together so that the same environmental changes affect all devices similarly.

Even so, slight mismatches exist and various correcting or compensating means are provided such as circuits for correcting for input offset currents and input offset voltage. These, as such, form no part of the invention. Temperature change compensating arrangements are known but are precise in only a narrow temperature range and are subject to some error at larger temperature changes. As such these arrangements, except as they become part of an input biasing current compensating mechanism are not part of the invention.

Even with all of the described refinements to input differential amplifier transistors, and when using the Darlington connection, some input bias current exists at all times, whether a signal is being received or not, and contributes to need for compensating circuits. The increase in bias currents due to environmental changes such as temperature or radiation flux may be small or large. Large doses of neutron radiation may degrade the betas of the transistors by a factor of 20 to one. The concomitant base current increase, while reflecting a common mode type of input signal, is nevertheless of such a magnitude that the common mode rejection mechanism does not adequately compensate for it, nor for the signal change occurring at the output terminals which disrupts the biases, etc., of circuit components fed from the differential amplifier. Accordingly, it is a further object of the invention to provide compensation for the presence of bias current, in effect to pass it out of the circuit, before and after environmental changes.

DESCRIPTION OF THE PRIOR ART

Known prior art patents and publications are U.S. Pat. No. 3,320,439 Widlar, U.S. Pat. No. 3,364,434 Widlar, U.S. Pat. No. 3,409,839 Crowe, U.S. Pat. No. 3,482,177 Sylvan, and Handbook of Operational Amplifier Applications published by Burr-Brown Research Corporation, First Edition, copyright 1963, U.S.A., specifically pages 42 and 43. None of this prior art teaches the subject invention of compensating input bias (base) currents of a transistor by providing a transistor of opposite conductivity type whose base is connected to the base of the first transistor and whose emitter collector is connected in the reverse sense.

SUMMARY OF THE INVENTION

According to one form of the invention, method and means for compensating for undesired environmentally induced changes of the base current as compared with the desired signal base current of a first transistor device of one conductivity type having its emitter and collector adapted to be connected across a source of supply, having its base adapted to be connected to a signal source, having certain transistor characteristics, and being adapted to be subjected to an environment susceptible of inducing such changes, are provided wherein a second transistor device of the opposite conductivity type having its emitter and collector adapted to be connected across the source of supply in opposite relation to said first transistor device and being adapted to be subjected to the same environment as said first transistor device, said second transistor device having essentially matched characteristics to said first transistor device, and the base of said second transistor device being connected to the base of said first transistor device.

According to another form of the invention, method and means for compensating for undesired environmentally induced changes of the base current as compared with the desired signal base current of a differential amplifier including a first pair of Darlington connected transistors of one conductivity type and a second pair of Darlington connected transistors of the same conductivity type, the emitters of the second stages of said first and said second Darlington pairs being connected together and to one side of a source of supply, the collectors of the first and second stages of said first Darlington pair being connected together, the collectors of the first and second stages of said second Darlington pair being connected together, balancing circuit means being connected between the connected collector of said first and said second Darlington pairs and the other side of said source of supply, the bases of the first stages of said first and second Darlington pairs being adapted to be connected differentially to a signal source, each of the transistors of said first and second Darlington pairs having certain transistor characteristics, all being adapted to be subjected to an environment susceptible of inducing such changes are provided wherein a third pair of Darlington connected transistors of opposite conductivity type to said first pair and having its emitter circuits and its collector circuits adapted to be connected across said source of supply in opposite relation to said first Darlington pair, the base of the first stage of said third Darlington pair being connected to the base of the first stage of said first Darlington pair and to one input of said differential source, a fourth pair of Darlington connected transistors of opposite conductivity type to said second pair and having its emitter circuits and its collector circuits adapted to be connected across said source of supply in opposite relation to said second Darlington pair, the base of the first stage of said fourth Darlington pair being connected to the base of the first stage of said second Darlington pair and to the other input of said differential source, the transistors of said first, second, third and fourth Darlington pairs being adapted to be subjected to the same environment, the transistors of said third and fourth Darlington pairs having essentially matched characteristics to the transistors of said first and second Darlington pairs, respectively.

DESCRIPTION OF THE PREFERRED EMBODIMENTS

Figure 1:
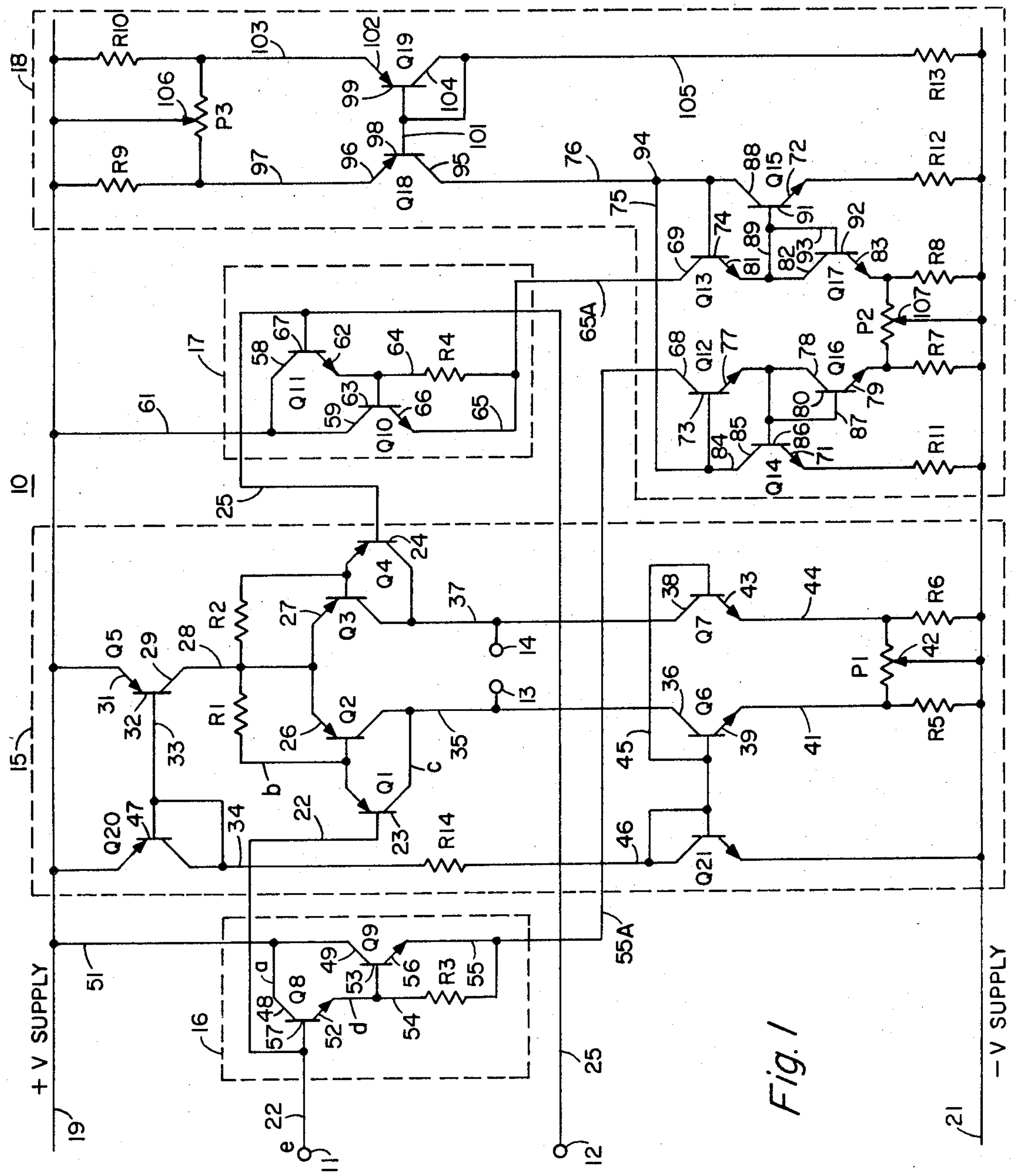
FIG. 1 is a circuit diagram of a differential amplifier embodying the invention.

Referring to the drawings, there is shown a differential amplifier 10 which may be the input stage of an operational amplifier (not shown), the latter typically including one or more intermediate stages and an output stage. The input terminals of differential amplifier 10 are identified by the reference characters 11 and 12 and the output terminals by 13 and 14. A differential input signal would be connected to terminals 11 and 12 and a differential output signal would be supplied from terminals 13 and 14 to other points in the operational amplifier (not shown) as is well understood.

The differential amplifier stage is shown as comprising a differential input Darlington group 15 including bias and current supplies as will be explained, two Darlington connected compensating groups 16 and 17 and a dual current source 18 for the compensating components 16 and 17, the dual current source 18 being neutron and gamma radiation hardened if desired.

As to the input Darlington group 15, PNP transistors Q1, Q2, Q3 and Q4 form an ordinary input differential Darlington connected amplifier pair. The PNP transistor Q5 and NPN transistors Q6 and Q7 are current sources for the transistors Q1, Q2, Q3 and Q4. Transistors Q20 (PNP) and Q21 (NPN) and resistor R14 are connected to form a typical bias string for biasing the transistors Q5 and Q6 and Q7.

The input bias or base currents to PNP transistors Q1 and Q2 are compensated for by the Darlington connected NPN transistors Q8 and Q9 of circuit 16. Similarly, the input bias or base currents of PNP transistors Q4 and Q3 are compensated for by the Darlington connected transistors NPN Q10 and Q11 of the compensating circuit 17.

Resistors R1 and R2, respectively, provide a DC bias for transistors Q1 and Q4 to assure that these transistors are turned on. To a similar purpose, resistors R3 and R4 provide a DC bias for the transistors Q8 and Q11. Resistors R5, R6 and the potentiometer resistor P1 enable current adjustment to be made.

The NPN transistors Q12, Q13, Q14, Q15, Q16 and Q17 and PNP transistors Q18 and Q19 form part of the dual current source 18. Resistors R7 and R8, along with potentiometer resistor P2 and resistors R11, R12, R13, R9 and R10 and potentiometer resistor P3 also form part of the dual current source 18.

Power is supplied to the differential amplifier 10 from bus bars or the like 19 and 21 labeled respectively as +V supply and −V supply.

The transistors Q1 and Q2 are connected as a Darlington pair and transistors Q3 and Q4 are also connected as a Darlington pair, the input from terminal 11 being connected to the base 23 of transistor Q1 through the conductor 22 and the input from the other terminal 12 being connected to the base 24 of transistor Q4 through the conductor 25.

The emitters 26 and 27, respectively, of transistors Q2 and Q3 are connected together to conductor 28 which in turn is connected to the collector 29 of transistor Q5, a current source. The emitter 31 of transistor Q5 is connected to the positive supply bus 19, and the base 32 is connected by means of conductor 33 to conductor 34 of the bias string.

The collectors of transistors Q1 and Q2 are connected together to the conductor 35, the conductor 35 being connected to the collector 36 of a current source transistor Q6, as will be explained. Similarly the collectors of transistors Q3 and Q4 are connected together and are connected by means of conductor 37 to the collector 38 of a transistor Q7 acting as a current source. The emitter 39 of transistor Q6 is connected by conductor 41 to one junction of resistor R5 and potentiometer resistor P1, the other terminal of resistor R5 being connected to the negative supply 21 and the movable contact 42 of the potentiometer P1 also being connected to the negative supply. The emitter 43 of transistor Q7 is connected through conductor 44 to the junction of resistor R6 and potentiometer resistor P1, the other terminal of resistor R6 being connected to the negative supply. The bases of transistor Q6 and Q7 are connected together by conductor 45 and to the conductor 46 of the bias string.

The transistor Q5, a PNP type, is a constant current source supplying a current I of which essentially one-half, I/2, goes to transistor Q2 and the other half goes to transistor Q3. From transistor Q2, I/2, flows through conductor 35, transistor Q6 and conductor 41 to the junction of potentiometer resistor P1 and resistor R5. Similarly, the current I/2 flows from transistor Q3 through conductor 37, transistor Q7 and conductor 44 to the junction of resistor R6 and potentiometer resistor P1. The transistor Q5 being a constant current source thus feeds a current I into the Darlington input pairs and the transistors Q6 and Q7 form constant current receiving components each demanding one-half of the current supplied through Q5.

The transistor Q5 is temperature compensated by having its base 32 connected to the base 47 of PNP transistor Q20 of the bias string.

Transistor Q20 of the PNP type and transistor Q21 of the NPN type are connected in reverse bias relative to each other and each is connected as a diode. The resistor R14 of about 36K ohms determines the current flowing in the bias string and the reverse bias connection of the transistors Q20 and Q21 compensates for effects of temperature change in the bias string circuit. Accordingly, the current supply transistor Q5 is temperature compensated by the diode connected transistor Q20 and the transistors Q6 and Q7 are temperature compensated by the diode connected transistor Q21.

Connected to base 23 of transistor Q1 through conductor 22 is the compensating circuit 16 which comprises the NPN transistors Q8 and Q9 connected as a Darlington pair with the collectors 48 and 49 of Q8 and Q9, respectively, connected together and through conductor 51 to the +V supply 19. The emitter 52 of transistor Q8 is connected to the base 53 of transistor Q9 and by conductor 54 to resistor R3 which in turn is connected through conductor 55 to the emitter 56 of transistor Q9. The base 57 of transistor Q8 is connected to conductor 22 and thus to the base 23 of transistor Q1 and to input terminal 11.

Similarly, the base 24 of transistor Q4 is connected through conductor 25 to the compensating circuit 17 which comprises the NPN transistors Q11 and Q10 connected as a Darlington pair with the collectors 58 and 59 of Q11 and Q10, respectively, connected together and through conductor 61 to the +V supply 19. The emitter 62 of transistor Q11 is connected to the base 63 of transistor Q10 and by conductor 64 to resistor R4 which in turn is connected through conductor 65 to the emitter 66 of transistor Q10. The base 67 of transistor Q11 is connected to conductor 25 and thus to the base 24 of transistor Q4 and to input terminal 12.

The resistors R3 and R4 make certain that the small current transistors Q8 and Q11 are biased on. In the compensating circuit 16, the transistors Q8 and Q9 are the complements of the transistors Q1 and Q2 of the principal circuit 15. That is, the transistors Q8 and Q9 are of the opposite conductivity type as compared with transistors Q1 and Q2. Similarly, the transistors Q10 and Q11 of the compensating circuit 17 are the complements of the transistors Q3 and Q4 of the principal circuit 15.

It will be clear that in the principal circuit, as well as in the compensating circuit, the opposite variety of conductivity type transistors may be used so long as the transistors in the compensating circuits 16 and 17 are the complements of those in the corresponding branches of the principal circuit. Elsewhere in the circuit also transistors of a conductivity type opposite to that shown may be used as is well understood.

In one form of the circuit, according to the invention, the transistors Q1, Q2, Q3, Q4, Q8, Q9, Q10 and Q11 are formed on the same chip, as in an integrated circuit, and the characteristics of these transistors are as closely matched to each other as is possible. That is, the betas of transistors Q1 and Q4 are made to match as closely as possible the betas of Q8 and Q11, respectively, and the betas of transistors Q2 and Q3 are made to match the betas of Q9 and Q10, respectively. When the foregoing conditions are attained and by the circuitry as will be described, the bias currents from transistors Q1 and Q2, and Q3 and Q4 are exactly compensated for.

The output conductors 55A and 65A from the compensating circuits 16 and 17 respectively are connected to the collectors 68 and 69 of NPN transistors Q12 and Q13, respectively, which are part of the radiation hardened dual current source 18 as previously referred to. Transistors Q12 and Q13 form high impedance nodes and thus prevent the compensating circuits 16 and 17 from loading the input terminals 11 and 12.

The dual current source 18 comprising the NPN transistors Q12, Q13, Q14, Q15, Q16 and Q17, and PNP transistors Q18 and Q19, resistors R7, R8, R9, R10, R11, R12 and R13 and potentiometer resistors P2 and P3, and which may constitute a neutron and gamma ray hardened radiation hardened adjustable power current source, is more particularly described and claimed in the application Ser. No. 7,164 filed Jan. 30, 1970, jointly for the same inventor and Leo L. Wisseman and assigned to the same assignee as the subject invention.

Transistors Q12, Q14 and the diode connected transistor Q16 are as closely matched to each other as possible. Specifically, the betas of these transistors are matched as closely as possible. Similarly, the transistors Q13, Q15 and diode connected transistor Q17 are as closely matched as possible and specifically the betas thereof are matched as closely as possible.

The bases 73 and 74 of transistors Q12 and Q13, respectively, are connected together by conductor 75 and thus to conductor 76. The emitter 77 of transistor Q12 is connected to the collector 78 of transistor Q16 and the emitter 79 thereof is connected to the junction of resistor R7 and potentiometer resistor P2, the other terminal of resistor R7 being connected to the negative supply 21. Similarly, the emitter 81 of transistor Q13 is connected to the collector 82 of transistor Q17 and the emitter 83 thereof is connected to the junction of potentiometer resistor P2 and resistor R8, the other terminal of resistor R8 being connected to the negative supply.

The base 73 of transistor Q12 is connected by conductor 84 to the collector 85 of transistor Q14 and the emitter 71 thereof is connected to one terminal of resistor R11, the other terminal of which is connected to the negative supply 21. The juncture of emitter 77 of transistor Q12 and the collector 78 of transistor Q16 is connected to the base 86 of transistor Q14 and the collector 78 is shorted to the base 80 by conductor 87. Similarly, the base 74 of transistor Q13 is connected to the collector 88 of transistor Q15 and the emitter 72 of transistor Q15 is connected to resistor R12, the other terminal of which is connected to the negative supply 21. The emitter 81 of transistor Q13 is connected by a conductor 89 to the base 91 of transistor Q15 and the base 92 of transistor Q17 is shorted to the collector 82 by conductor 93.

As indicated, the bases 73 and 74 of transistors Q12 and Q13 are connected together and to conductor 76 at the junction point 94. Conductor 76 is connected to the collector 95 of transistor Q18, the emitter 96 of which is connected through conductor 97 to the junction of potentiometer resistor P3 and one terminal of resistor R9. The other terminal of R9 is connected to the positive supply 19. The base 98 of transistor Q18 is connected to the base 99 of transistor Q19 through conductor 101. The emitter 102 of transistor Q19 is connected by conductor 103 to the junction of potentiometer resistor P3 and resistor R10, the other terminal of which is connected to the positive supply 19. The base 99 of transistor Q19 is shorted to the collector 104 which is connected through conductor 105 to one terminal of resistor R13, the other terminal of which is connected to the negative supply 21.

The transistors Q18 and Q19 and particularly the betas thereof are matched as closely as possible to transistor Q15 and to the other transistors in the current supply. When the transistors of the current supply circuit 18 are matched as described and as described in the pending application referred to, the currents in conductors 55A and 65A respectively are made equal to each other and are equal to one-half of the current flowing in the conductor 76. The transistors Q18 and Q19, together with the resistors R12, R13, R9 and R10, determine the current flowing in conductor 76 as described in the application referred to and any adjustment needed in the magnitude of this current is obtained by varying the potentiometer movable contact 106. As described in the copending application, the dual current source 18 is gamma and neutron radiation hard and under all circumstances, when appropriately adjusted, will cause equal currents to flow in the conductors 55A and 75A. Any minor mismatches in the currents in conductors 55A and 65A may be adjusted by means of the potentiometer contact 107 along with resistors R7 and R8.

The match of the betas of the transistors Q8 and Q9 of compensating circuit 16 with the betas of transistors Q1 and Q2 of one Darlington pair and the corresponding match of the betas of transistors Q10 and Q11 of compensating circuit 17 with the betas of transistors Q3 and Q4 of the other Darlington pair necessary to achieve the benefits of the invention may be obtained by discrete devices but are more readily obtained by using integrated circuits. In the latter case, since the devices are made during the same process steps, making the devices as identical to each other as possible is very closely obtainable. Moreover, in this case the devices are placed very close to each other and thus are subject to the same environmental effects such as neutron or gamma radiation or temperature. Hence, changes in betas caused by these or other factors affect all devices in the same way.

However by proper testing, selection and location, discrete devices can be made and connected to obtain the desired matching of characteristics. Similarly, by careful selection, or by integrated circuit techniques, the transistors of dual current source 18 and the transistors of the other current sources and bias circuits may be matched as described.

The various resistors and potentiometers are formed externally, in the case of integrated circuits, and are connected to the appropriate devices by conductors extending externally from the integrated circuit.

The bias currents (base currents) of the Darlington pair of transistors Q8 and Q9 compensate for the bias currents (base currents) of the Darlington pair of transistors Q1 and Q2. The bias current flows out of the base 23 of PNP transistor Q1 and into the base 57 of NPN transistor Q8 and ultimately out of the amplifier circuit through Q12. The Darlington pair Q8 and Q9 of one conductivity type form a low impedance path ready to receive any bias current from the Darlington pair Q1 and Q2 of the opposite, or complementary, conductivity type.

Similarly, the bias currents (base currents) of the Darlington pair of transistors Q10 and Q11 (NPN) compensate for any bias currents (base currents) of the Darlington pair of transistors Q3 and Q4 (PNP), the two Darlington pairs of transistors being of opposite, or complementary, conductivity types.

If the betas of transistors Q1 and Q4 match the betas of transistors Q8 and Q11, respectively, and the betas of transistors Q2 and Q3 match the betas of transistors Q9 and Q10, respectively, the input bias currents from terminals 11 and 12 are equal to zero and the input offset currents are equal to zero. If the compensating transistors Q8–Q11 are not exact complements of transistors Q1–Q4, R7, R8 and P2 may be adjusted to balance the input offset current and R9, R10 and P3 may be adjusted to balance the input bias currents to zero. R5, R6 and P1 may be adjusted to balance the input offset voltage to zero.

The increase in bias currents of transistors Q1–Q4 when exposed to heavy doses of neutron radiation, for example, decreases in beta of twenty to one are typical, are compensated by the transistors Q8–Q11. Such compensation is vital in missile applications to avoid malfunctioning in neutron radiation environments.

Since both Darlington differential amplifiers and compensating circuits are on the same die or chip, in the case of an integrated circuit, they receive the same neutron flux and will change in the same proportion under such exposure. Compensation for input bias currents is thus achieved.

At a particular temperature, all input bias current can be compensated, and the temperature dependance of the input bias current is much improved both in magnitude and differentially.

Figure 2:
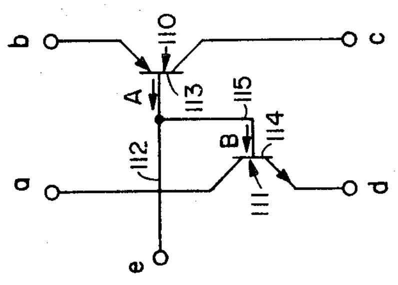
FIG. 2 is a partial circuit diagram of an elemental form of the invention.

In fundamental form, the invention is shown in FIG. 2, there being one PNP transistor 110 whose input base, or bias, current is to be compensated by the input base, or bias, current of complementary NPN transistor 111. The terminals *a*, *b*, *c*, *d*, and *e* may be connected to points of the circuit of FIG. 1 at the correspondingly identified points.

In FIG. 2, the signal input is at point e which is connected by conductor 112 to the base 113 of transistor 110. Input bias, or base, current flows out of base 113, conventionally, as shown by the arrow A. If no other path is provided, this current will flow out of the input terminal *e* which is undesirable. Terminals *b* and *c* are, of course, connected to a suitable voltage supply.

The transistor 111 has its base 114 connected to the base 113 of transistor 110 by conductor 115. Transistor 111 is of the NPN type, or of the opposite conductivity type so that of transistor 110. The input bias, or base, current of transistor 111 flows into the base (conventionally) as shown by the arrow B. If the betas of transistor 110 and 111 are equal, i.e., the transistors are matched in their characteristics, outflow of current from base 113 will exactly equal the inflow of current into base 114. That is, base 114 provides a low impedance path for the current from base 113 and such base current does not flow out of terminal *e*. The base current of transistor 110 is thus compensated. The collector and emitter terminals *a* and *b* respectively are connected to a suitable voltage supply, for example, the same one terminals *b* and *c* are connected to. Appropriate other circuit components such as resistors are provided as is well understood.

While particular forms of the invention have been disclosed, it will be understood that other forms may be conceived which will be within the scope of the disclosure.

What is claimed is:

1. A circuit for compensating for undesired environmentally induced changes of the base currents as compared with the signal base currents of a first pair of transistors of one conductivity type connected as a differential pair and having their emitters and collectors adapted to be connected across a source of supply, having their bases adapted to be connected to a signal source, having certain transistor characteristics, and being adapted to be subjected to the environment susceptible of inducing such changes comprising a second pair of transistors of the opposite conductivity type having their emitters and collectors adapted to be connected across said source of supply in opposite relation to said first transistors and being adapted to be subjected to the same environment as said first pair of transistors, said second pair of transistors having essentially matched characteristics to said first pair of transistors, the base of one of said second pair of transistors being connected to the base of one of said first pair of transistors, and the base of the other one of said second pair of transistors being connected to the bases of the other one of said first pair of transistors.

2. A circuit for compensating for undesired environmentally induced changes of the base current as compared with the signal base current of a different amplifier including a first pair of Darlington connected transistors of one conductivity type and a second pair of Darlington connected transistors of the same conductivity type, the emitters of the second stages of said first and said second Darlington pairs being connected together and to one side of a source of supply, the collectors of the first and second stages of said first Darlington pair being connected together, the collectors of the first and second stages of said second Darlington pair being connected together, balancing circuit means being connected between the connected collector of said first and said second Darlington pairs and the other side of said source of supply, the bases of the first stages of said first and second Darlington pairs being adapted to be connected differentially to a signal source, each of the transistors of said first and second Darlington pairs having certain transistor characteristics, all being adapted to be subjected to the environment susceptible of inducing such changes comprising a third pair of Darlington connected transistors of opposite conductivity type to said first pair and having its emitter circuits and its collector circuits adapted to be connected across said source of supply in opposite relation to said first Darlington pair, the base of the first stage of said third Darlington pair being connected to the base of the first stage of said first Darlington pair and to one input of said differential source, a fourth pair of Darlington connected transistors of opposite conductivity type to said second pair and having its emitter circuits and its collector circuits adapted to be connected across said source of supply in opposite relation to said second Darlington pair, the base of the first stage of said fourth Darlington pair being connected to the base of the first stage of said second Darlington pair and to the other input of said differential source, the transistors of said first, second, third and fourth Darlington pairs being adapted to be subjected to the same environment, the transistors of said third and fourth Darlington pairs having essentially matched characteristics to the transistors of said first and second Darlington pairs, respectively.

3. The invention according to claim 1 wherein the connected emitter circuits of said first and second Darlington pairs includes a transistor constant current source means.

4. The invention according to claim 3 wherein the emitter collector circuits of said third and fourth Darlington pairs include transistor components for balancing input offset current essentially to zero and to balance input bias currents essentially to zero.

5. The invention according to claim 3 wherein the emitter collector circuits of said first and second Darlington pairs include transistor components for adjusting input offset voltage essentially to zero.

6. The invention according to claim 3 wherein the emitter collector circuits of said third and fourth Darlington pairs include transistor components for balancing input currents essentially to zero and to balance input bias currents essentially to zero, and wherein the emitter collector circuits of said first and second Darlington pairs include transistor components for adjusting input offset voltage essentially to zero.

7. The invention according to claim 2 wherein the transistors of said first, second, third and fourth Darlington pairs are formed on the same chip.

8. The invention according to claim 2 wherein the transistors of said first and second Darlington pairs are of the PNP type and the transistors of the second and fourth Darlington pairs are of the NPN type.

9. The invention according to claim 6 wherein the transistors are mounted on the same chip.

10. A circuit for compensating for undesired environmentally induced changes of the base current as compared with the signal base current of a differential amplifier including a first pair of Darlington connected transistors of one conductivity type and a second pair of Darlington connected transistors of the same conductivity type, the emitters of the second stages of said first and said second Darlington pairs being connected together and to one side of a source of supply, the collectors of the first and second stages of said first Darlington pair being connected together, the collectors of the first and second stages of said second Darlington pair being connected together and being adapted to be connected to the other side of said source of supply, the bases of the first stages of said first and second Darlington pairs being adapted to be connected differentially to a signal source, each of the transistors of said first and second Darlington pairs having certain transistor characteristics, all being adapted to be subjected to the environment susceptible of inducing such changes comprising a third pair of Darlington connected transistors of opposite conductivity type to said first pair and having its emitter circuits and its collector circuits adapted to be connected across said source of supply in opposite relation to said first Darling pair, the base of the first stage of said third Darlington pair being connected to the base of the first stage of said first Darlington pair and to one input of said differential source, a fourth pair of Darlington connected transistors of opposite conductivity type to said second pair and having its emitter circuits and its collector circuits adapted to be connected across said source of supply in opposite relation to said second Darlington pair, the base of the first stage of said fourth Darlington pair being connected to the base of the first stage of said second Darlington pair and to the other input of said differential source, the transistors of said first, second, third and fourth Darlington pairs being adapted to be subjected to the same environment, the transistors of said third and fourth Darlington pairs having essentially matched characteristics to the transistors of said first and second Darlington pairs, respectively.

* * * * *